(12) United States Patent
Ji (10) Patent No.: US 7,324,796 B2
(45) Date of Patent: Jan. 29, 2008

(54) LOW TEMPERATURE CO-FIRED CERAMIC SUB-HARMONIC MIXER

(75) Inventor: Daxiong Ji, Brooklyn, NY (US)

(73) Assignee: Scientific Components, Brooklyn, NY (US)

( * ) Notice: Subject to any disclaimer, the term of this patent is extended or adjusted under 35 U.S.C. 154(b) by 490 days.

(21) Appl. No.: 11/073,479

(22) Filed: Mar. 7, 2005

(65) Prior Publication Data

US 2006/0199561 A1 Sep. 7, 2006

(51) Int. Cl.
*H04B 1/18* (2006.01)
*H04B 1/28* (2006.01)
*H04B 1/26* (2006.01)

(52) U.S. Cl. .................. 455/296; 455/318; 455/326; 455/330; 455/333; 455/130; 327/208

(58) Field of Classification Search ............ 455/293, 455/333, 326, 130, 280, 255, 258, 262, 265, 455/281–282, 287, 289–290, 291–292, 313, 455/316, 318–319, 323–324, 325, 327, 330, 455/334; 327/206–208, 210, 220, 272, 329, 327/355, 359
See application file for complete search history.

(56) References Cited

U.S. PATENT DOCUMENTS

| | | | | |
|---|---|---|---|---|
| 5,060,298 | A | 10/1991 | Waugh et al. | 455/326 |
| 5,774,801 | A | 6/1998 | Li et al. | 455/326 |
| 5,854,974 | A | 12/1998 | Li | 455/330 |
| 5,903,820 | A * | 5/1999 | Hagstrom | 455/82 |
| 5,987,315 | A * | 11/1999 | Nishida | 455/327 |
| 6,108,529 | A | 8/2000 | Vice et al. | 455/323 |
| 6,140,892 | A * | 10/2000 | Uda et al. | 333/204 |
| 6,263,198 | B1 | 7/2001 | Li | 455/327 |
| 6,275,687 | B1 | 8/2001 | Lloyd | 455/292 |
| 6,278,872 | B1 | 8/2001 | Poulin et al. | 455/333 |
| 6,317,590 | B1 * | 11/2001 | Nash et al. | 455/331 |
| 6,343,211 | B1 | 1/2002 | Thodesen et al. | 455/317 |
| 6,348,830 | B1 * | 2/2002 | Rebeiz et al. | 327/355 |
| 6,427,059 | B1 * | 7/2002 | Buch et al. | 399/110 |
| 6,427,069 | B1 | 7/2002 | Galin | 455/326 |
| 6,438,563 | B1 | 8/2002 | Kawagoe | 707/201 |
| 6,587,699 | B2 | 7/2003 | Olsen et al. | 455/562 |
| 6,611,696 | B2 | 8/2003 | Chedester et al. | 455/562.1 |
| 6,653,885 | B2 | 11/2003 | Wu et al. | 327/356 |
| 6,665,546 | B2 | 12/2003 | Slaughter et al. | 455/562.1 |
| 6,714,800 | B2 | 3/2004 | Johnson et al. | 455/561 |
| 6,804,500 | B2 | 10/2004 | Yamaguchi | 455/127.1 |
| 6,807,407 | B2 | 10/2004 | Ji | 455/326 |
| 6,917,796 | B2 | 7/2005 | Setty et al. | 455/326 |
| 6,937,456 | B2 * | 8/2005 | Pasternak | 361/272 |
| 6,957,055 | B2 | 10/2005 | Gamliel | 455/323 |
| 6,959,180 | B2 | 10/2005 | Ji | 455/333 |
| 7,013,122 | B2 | 3/2006 | Gamliel | 455/330 |
| 7,072,636 | B2 | 7/2006 | Dobrovolny | 455/313 |
| 2006/0057988 | A1 * | 3/2006 | Kirdhart | 455/189.1 |

* cited by examiner

*Primary Examiner*—Pablo N. Tran
(74) *Attorney, Agent, or Firm*—Siegmar Silber (57) ABSTRACT

A sub harmonic mixer has improved electrical performance in a small package size. The mixer has a low temperature co-fired ceramic substrate. Coupled lines are located within the substrate and connected to an LO port, an RF port and an intermediate frequency port. Three capacitors are formed within the substrate. Vias extend through the substrate. A diode package is mounted on the substrate.

20 Claims, 13 Drawing Sheets

LOW TEMPERATURE CO-FIRED CERAMIC SUB-HARMONIC MIXER

BACKGROUND

1. Field of the Invention

This invention relates to mixers in general and more particularly to a sub-harmonic mixer that has improved electrical performance in a small package size.

2. Description of Related Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates inter-modulation products due to the non-linearity response.

The isolation between the local oscillator port and the radio frequency port is called L-R isolation. In a mixer, there is parasitic coupling that results in some of the LO signal leaking into the RF port. If the LO signal frequency is close to the RF signal frequency, the parasitic coupling is difficult to filter at the RF port.

While various mixers have been used, a continuing need exists for a mixer that has improved electrical performance in particular improved L-R isolation, that is compact and that can be manufactured at low cost.

SUMMARY

It is a feature of the invention to provide a sub harmonic mixer that has improved electrical performance in a small package size.

Another feature of the invention to provide a mixer that includes a first and second coupled line. The first coupled line is connected to a local oscillator port for receiving a local oscillator signal. A third coupled line has one end connected to the first coupled line and the other end connected to ground. A sixth coupled line has one end connected to the second coupled line and the other end connected to ground. A seventh line has one end connected to ground and the other end connected to a first node. One end of a fourth and fifth coupled lines are connected to the first node. A first capacitor is connected between the first node and ground. Four diodes are connected together. The cathode of one diode is connected to the anode of another diode. The other end of the fourth and fifth coupled lines are connected to the diodes. An eighth line has one end connected to the diodes and another end connected to an intermediate frequency port. A second capacitor is connected between the eighth line and a radio frequency port. A third capacitor is connected between the intermediate frequency port and ground.

BRIEF DESCRIPTION OF THE DRAWINGS

It is noted that the drawings of the invention are not to scale. In the drawings, like numbering represents like elements between the drawings.

DETAILED DESCRIPTION

Figure 1:
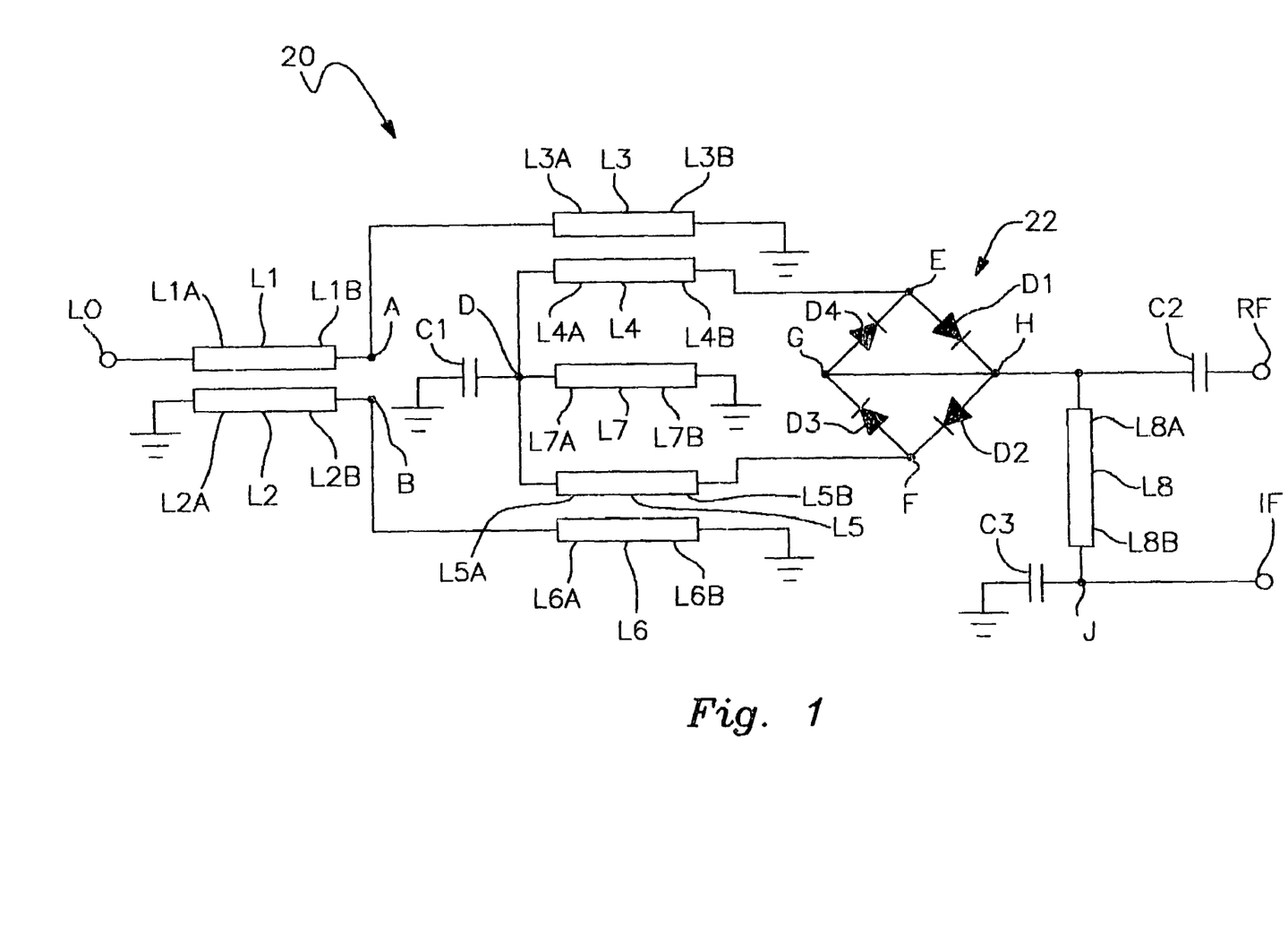
FIG. 1 is a schematic drawing of a sub harmonic mixer.

FIG. 1 shows a schematic diagram of a sub harmonic mixer 20. Mixer 20 has a local oscillator input terminal LO for receiving a local oscillator signal, an RF input terminal RF for receiving an RF signal and an intermediate frequency output terminal IF for providing an intermediate frequency output signal. Mixer 20 is a balanced mixer.

Local oscillator terminal LO is connected to a coupled line L1. Coupled line L1 has ends L1A and L1B. End L1A is connected to terminal LO. Coupled line L2 has ends L2A and L2B. Coupled lines L1 and L2 are electro-magnetically coupled to each other. End L2A is connected to ground.

Coupled line L3 has ends L3A and L3B. End L3B is connected to ground. Coupled line L4 has ends L4A and L4B. Coupled lines L3 and L4 are electro-magnetically coupled to each other. End L3A is connected to end L1B. End L4A is connected to node D.

Coupled line L5 has ends L5A and L5B. Coupled line L6 has ends L6A and L6B. End L5A is connected to node D. Coupled lines L5 and L6 are electro-magnetically coupled to each other. End L6A is connected to end L2B. End L6B is connected to ground.

Inductor L7 has ends L7A and L7B. End L7A is connected to end node D. End L7B is connected to ground. A capacitor C1 is connected between node D and ground.

A diode assembly 22 has diodes D1, D2, D3 and D4. The diodes have their cathodes connected to the anodes of the adjoining diodes. Diode assembly 22 has nodes E, F, G and H. Node E is connected to end L4B. Node F is connected to end L5B. The diodes are schottky diodes.

RF input terminal RF is connected to one end of capacitor C2. The other end of capacitor C2 is connected to node H. Inductor L8 has ends L8A and L8B. End L8A is connected to node H. End L8B is connected to node J. Intermediate frequency terminal IF is connected to node J. Capacitor C3 has one end connected to node J and the other end connected to ground.

In operation of sub harmonic mixer 20, the LO signal becomes a differential signal at nodes A and B. The differential signals are applied to diodes D1-D4 at nodes E and F. The LO frequency depends on the length of the coupled lines. The LO frequency is approximately one-half of the RF frequency. Since, the LO signal frequency is far from the RF signal frequency, any parasitic coupling is easily filtered at the RF port.

The selection of the inductance value of inductor L7 can improve the unbalance of the LO differential signal at nodes E and F. Nodes G and H are shorted together. The selection of the values of capacitor C1 and C2 can compensate for the effect of coupled lines L4 and L5 and therefore match to the RF port. Capacitor C2 blocks the IF signal from the RF port. Inductor L8 blocks the RF signal from the IF port. Capacitor C3 bypasses the RF signal at the IF port.

Referring now to FIGS. 2-6, the sub harmonic mixer 20 shown in the schematic of FIG. 1 is realized in a physical package. Sub harmonic mixer assembly 40 has a low temperature co-fired ceramic (LTCC) structure or substrate 43. LTTC substrate 43 is comprised of multiple layers of LTCC material. There are six LTCC layers in total. Planar layers 44, 46, 48, 50, 52 and 54 are all stacked on top of each other and form a unitary structure 43 after firing in an oven. Layer 44 is the top layer. Layer 54 is the bottom layer and layers 46, 48, 50 and 52 form inner layers 43. LTCC layers 44-54 are commercially available in the form of a green unfired tape. Each of the layers has a top surface 44A, 46A, 48A, 50A, 52A and 54A. Similarly, each of the layers has a bottom surface 44B, 46B, 48B, 50B, 52B and 54B. The layers have several circuit features that are patterned on the surfaces. Multiple vias 68 extend through each of the layers. Vias 68 are formed from an electrically conductive material and electrically connect the circuit features on one layer to the circuit features on another layer.

Figure 2:
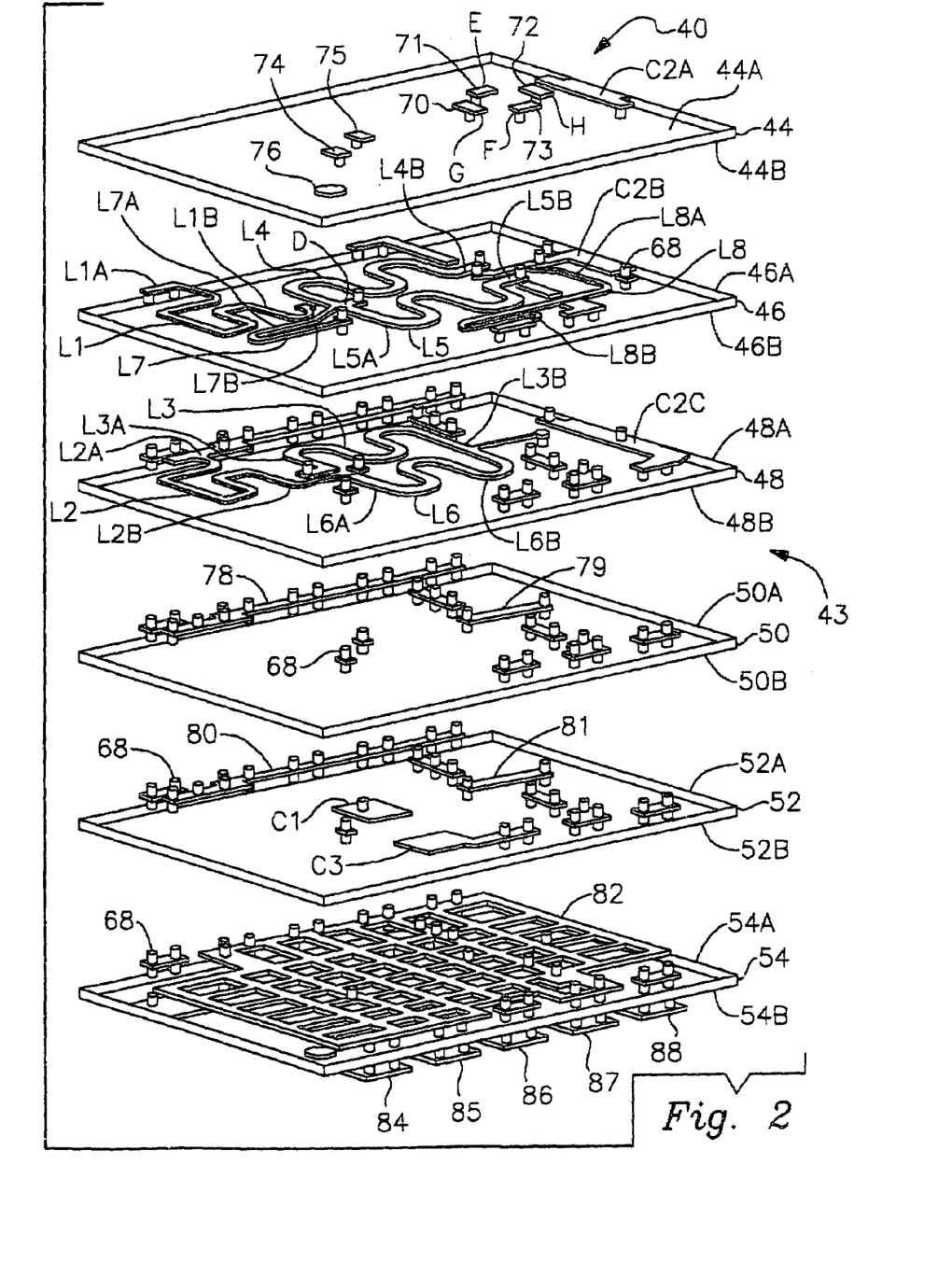
FIG. 2 is an exploded perspective view of the physical layout of the sub harmonic mixer of FIG. 1.

Layer 44 has several circuit features that are patterned on surface 44A. Surface 44A has wire bond pads 70, 71, 72 and 73, test pads 74, 75, orientation mark 76, capacitor electrode C2A and glass epoxy dam 98.

Layer 46 has circuit lines or coupled lines L1, L4, L5 and inductor lines L7 and L8 are patterned on surface 46A. Coupled lines L1, L4, L5 and inductors L7 and L8 have ends L1A, L1B, L4A, L4B, L5A, L5B, L7A, L7B, L8A and L8B. Similarly, layer 48 has coupled lines L2, L3 and L6 patterned on surface 48A. Coupled lines L2, L3 and L6 have ends L2A, L2B, L3A, L3B, L6A and L6B.

The coupled lines have a winding, snake like or sinuous shape. The coupled lines L1 and L2 are located on top of each other with layer 46 located in between. The coupled lines L3 and L4 are located on top of each other with layer 46 located in between. The coupled lines L5 and L6 are located on top of each other with layer 46 located in between. Coupled lines L1 and L2 are electro-magnetically coupled. Coupled lines L3 and L4 are electro-magnetically coupled. Coupled lines L5 and L6 are electro-magnetically coupled.

Layer 50 has a ground buss 78 and connecting line 79 formed on surface 50A. Layer 52 has a ground buss 80, connecting line 81 and capacitor electrodes C1 and C3 formed on surface 52A. Layer 54 has a ground plane 82 formed on surface 54A. Layer 54 has terminals 84, 85, 86, 87, 88, 89, 90, 91, 92 and 93 and orientation mark 94 formed on surface 54B. Terminal 86 corresponds to the IF port. Terminal 88 corresponds to the RF port. Terminal 89 corresponds to the LO port.

The ground plane 82 helps to prevent warping of the LTCC structure during fabrication and also acts as an impedance reference plane and reduces cross-talk noise and externally coupled EMI noise.

The circuit features, such as the couple lines, are formed by screening a thick film paste material and firing in an oven. This is a conventional process that is well known in the art. First, the LTCC layers have via holes punched, the vias are then filled with a conductive material. Next, the circuit features are screened onto the layers. The pads, ground connections, ground plane and circuit lines are formed with a conductive material. The layers are then aligned and stacked on top of each other to form LTCC substrate 43. The LTCC substrate 43 is then fired in an oven at approximately 900 degrees centigrade to form a unitary piece.

Figure 3:
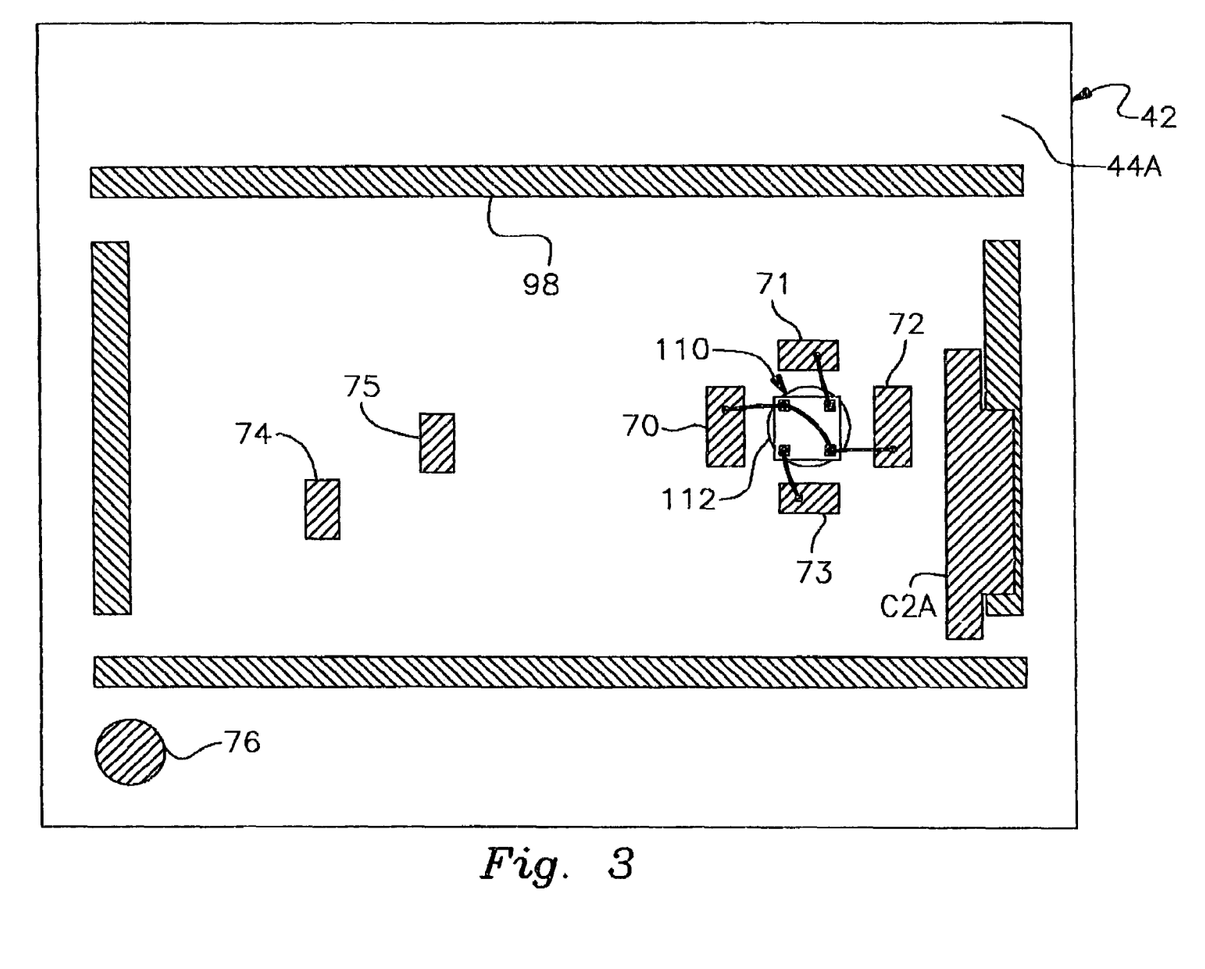
FIG. 3 is a top assembled view of FIG. 2.
Figure 4:
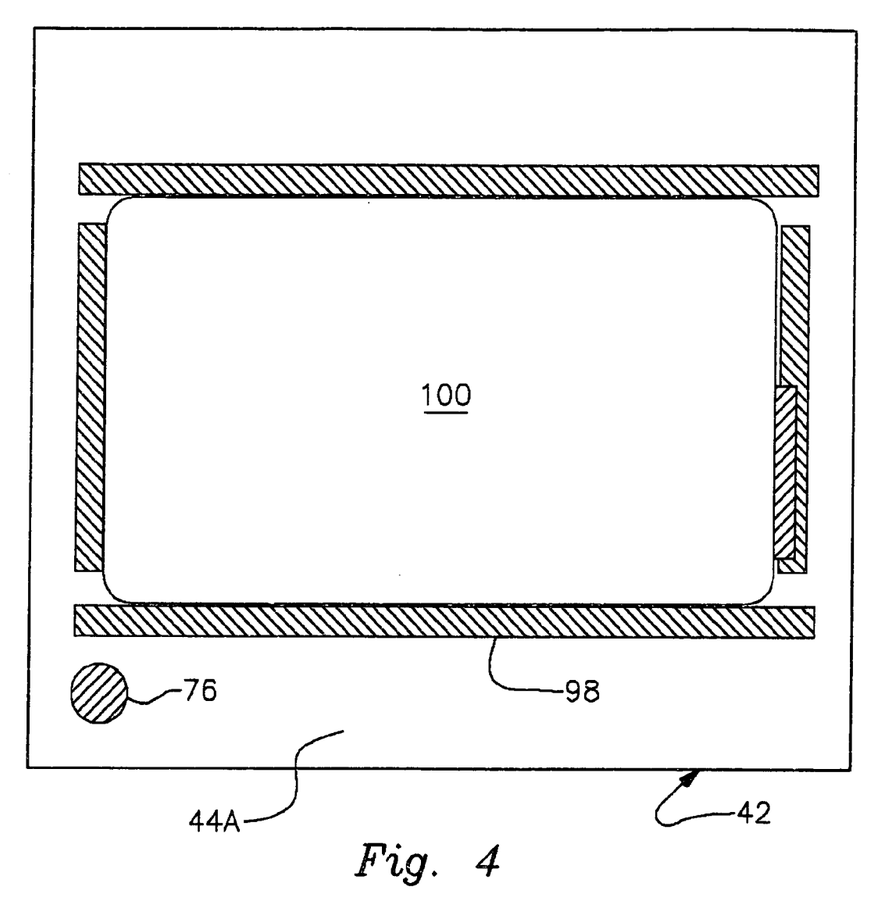
FIG. 4 is a top assembled view of FIG. 2 including the epoxy seal.
Figure 5:
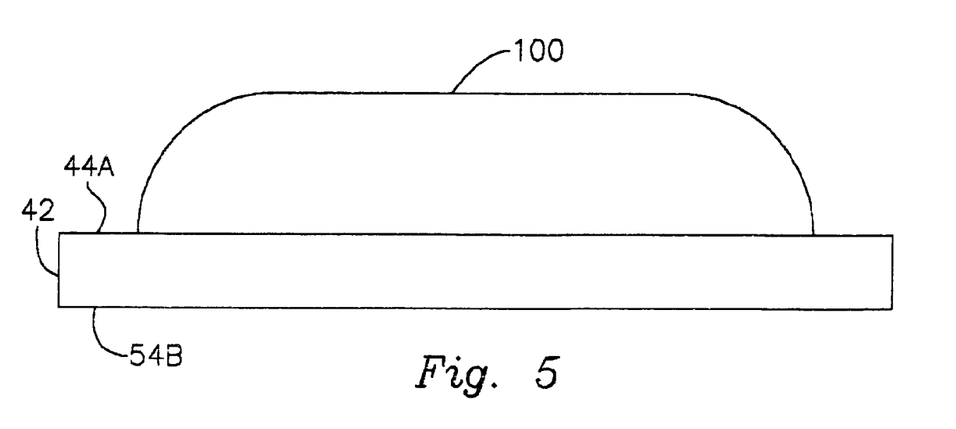
FIG. 5 is a side view of FIG. 4.

After firing, a diode semiconductor die 110 is attached to top surface 44A by an epoxy 112. Die 110 contains the four diodes D1, D2, D3 and D4. The die or semiconductor chip is used in bare form to reduce size and cost. Wire bonds 114 are placed between connection points on the die and wire bond pads 70, 71, 72 and 73. Epoxy 100 is placed over the die 110 after wire bonding for protection.

Figure 6:
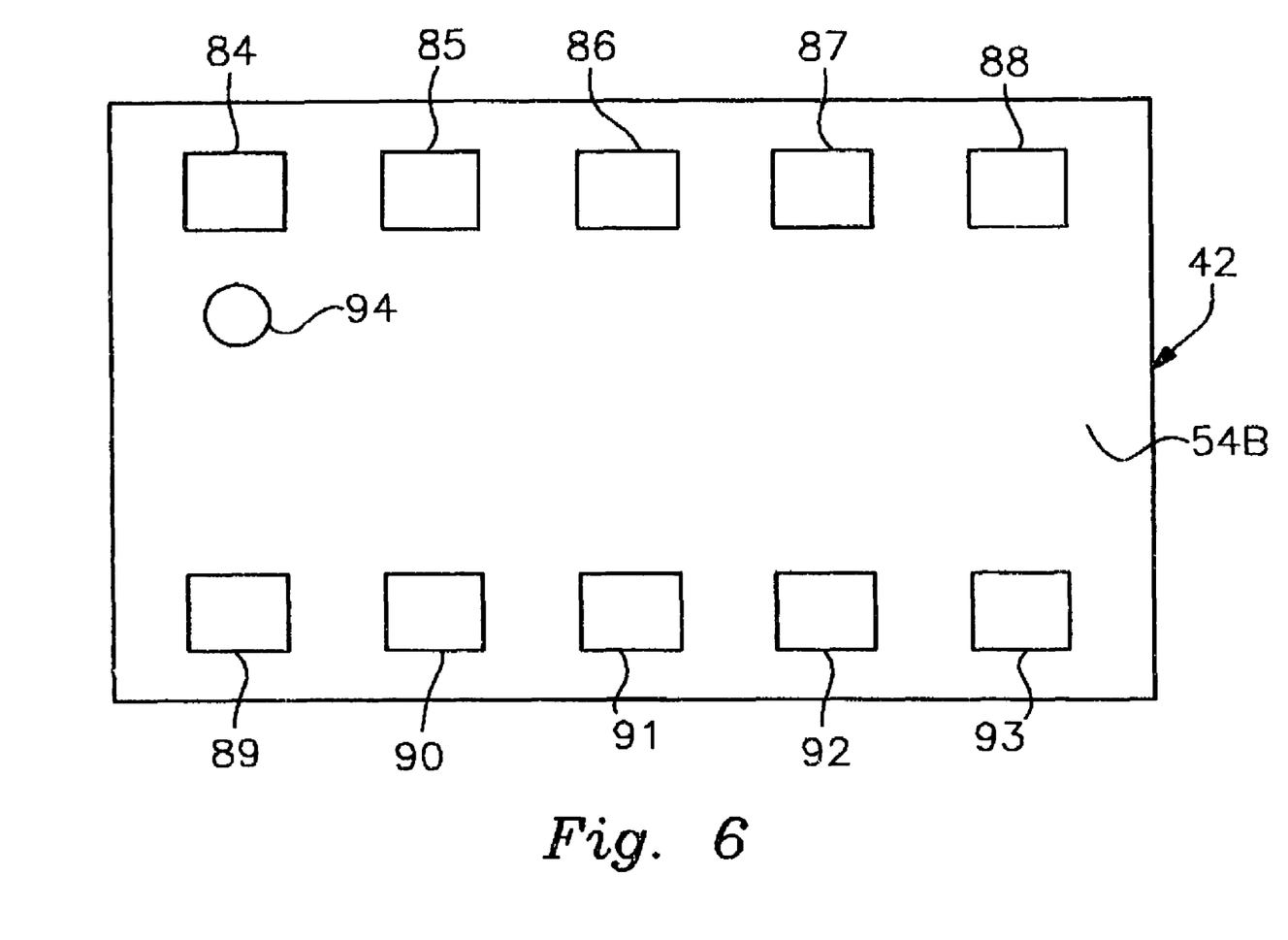
FIG. 6 is a bottom view of FIG. 2.

Sub harmonic mixer assembly 40 would be mounted to a printed circuit board by soldering terminals 84-93 to a printed circuit board (not shown). Metal leads can also be soldered to terminals 84-93.

A substrate 43 according to the present invention was fabricated having dimensions of 0.3 inches in length by 0.25 inches wide by 0.085 inches in height. Coupled line L1 had a length of 0.3 inches and a width of 0.004 inches. Coupled line L2 had a length of 0.3 inches and a tapered width that varies. Coupled line L3 had a length of 0.288 inches and a width of 0.008 inches. Coupled line L4 had a length of 0.288 inches and a width of 0.008 inches. Coupled line L5 had a length of 0.288 inches and a width of 0.008 inches. Coupled line L6 had a length of 0.288 inches and a width of 0.008 inches. Inductor L7 had a length of 0.15 inches and a width of 0.004 inches.

Inductor L8 had a length of 0.269 inches and a width of 0.004 inches. Capacitor C1 has a value of 0.58 picofarads. Capacitor C2 has a value of 0.82 picofarads. Capacitor C3 has a value of 0.63 picofarads. The LTCC layers have a dielectric constant of 7.5.

The sub harmonic mixer was optimized for an LO frequency of 2500 to 2900 MHz and an RF frequency of 5000 to 5800 MHz. The mixer was measured for electrical performance. It is noted that the mixer can be fabricated using the present invention for higher and lower frequencies than was shown in the present example.

Figure 7:
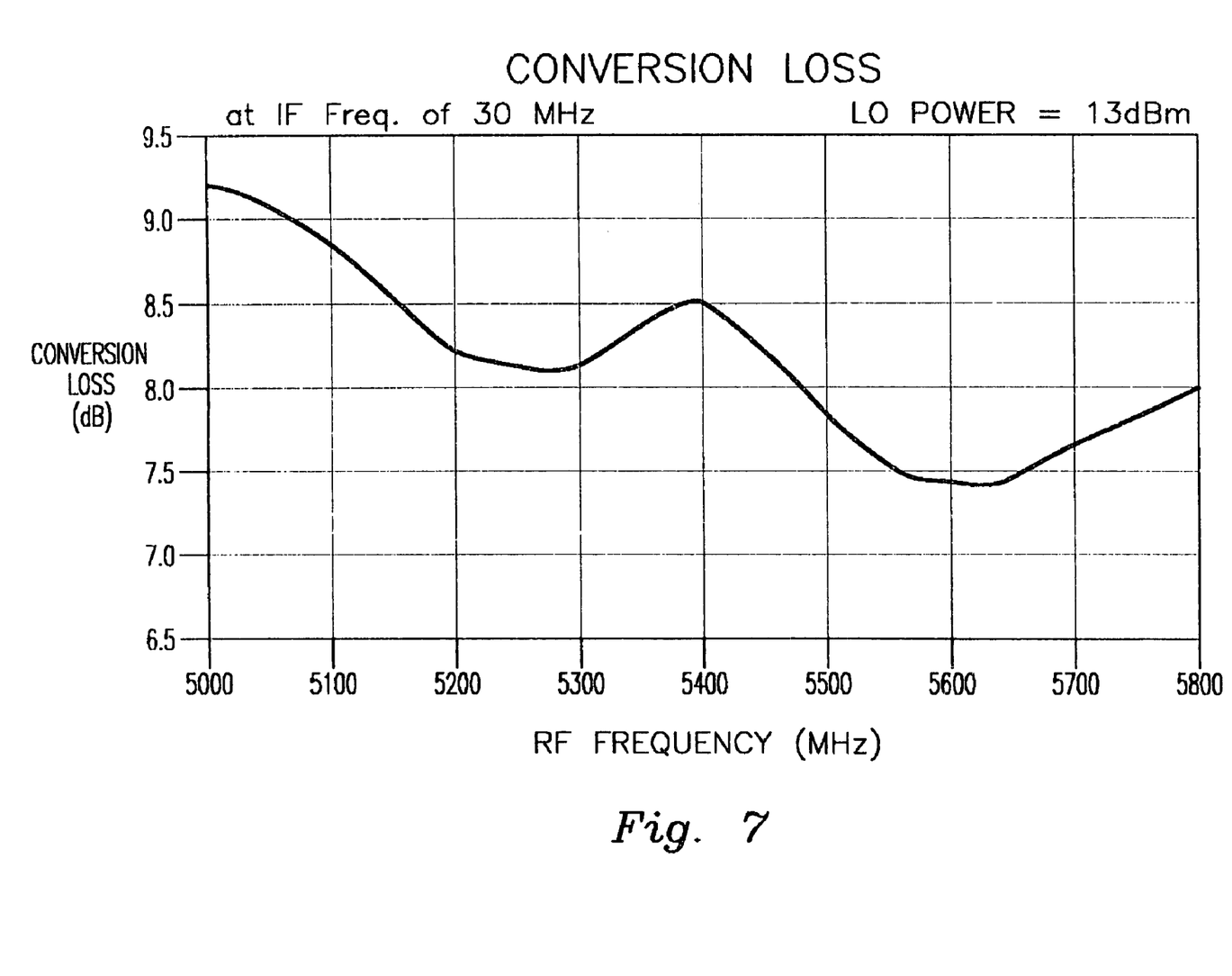
FIG. 7 is a graph of conversion loss versus frequency.
Figure 8:
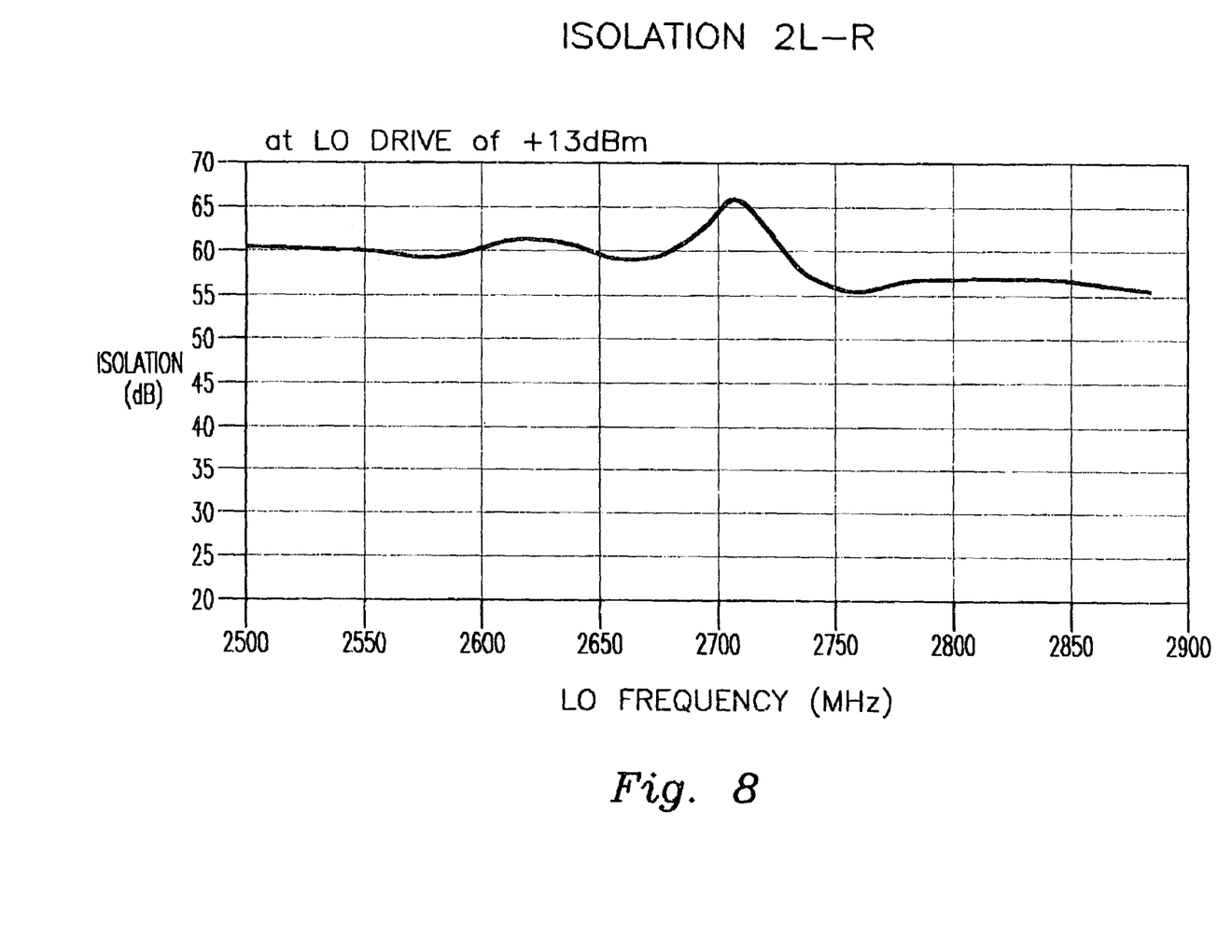
FIG. 8 is a graph of 2L-R isolation versus frequency.
Figure 9:
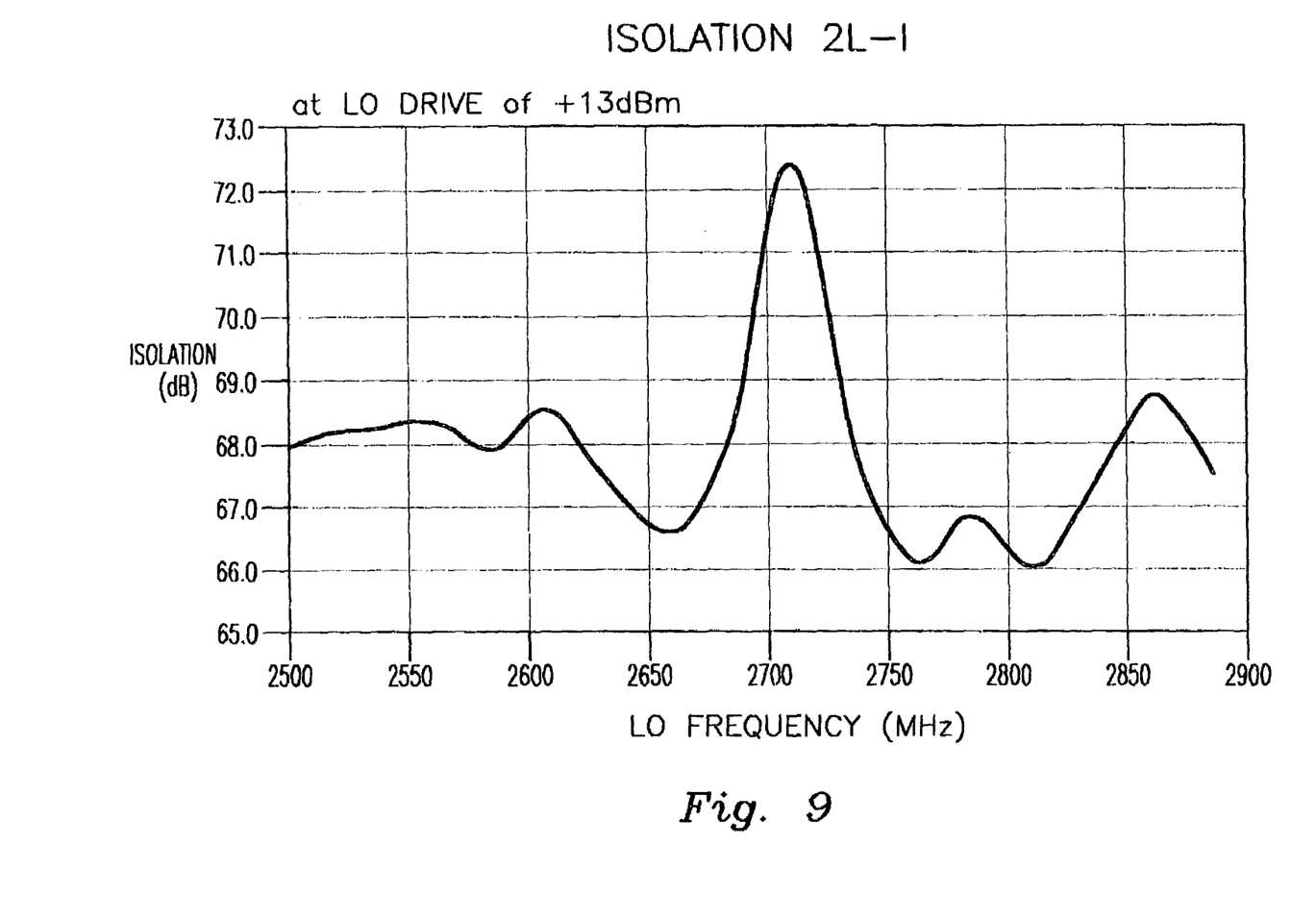
FIG. 9 is a graph of 2L-I isolation versus frequency.
Figure 10:
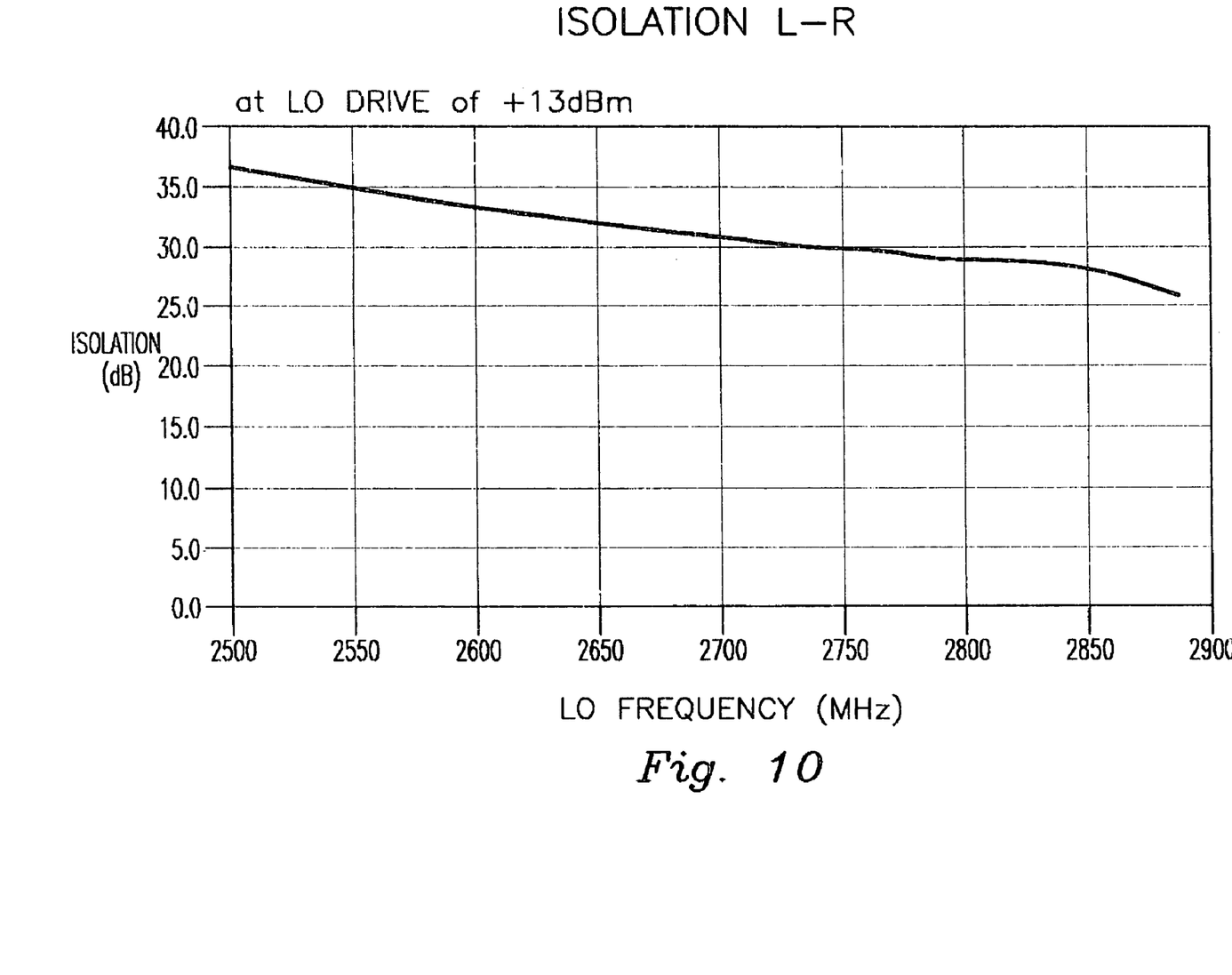
FIG. 10 is a graph of L-R isolation versus frequency.
Figure 11:
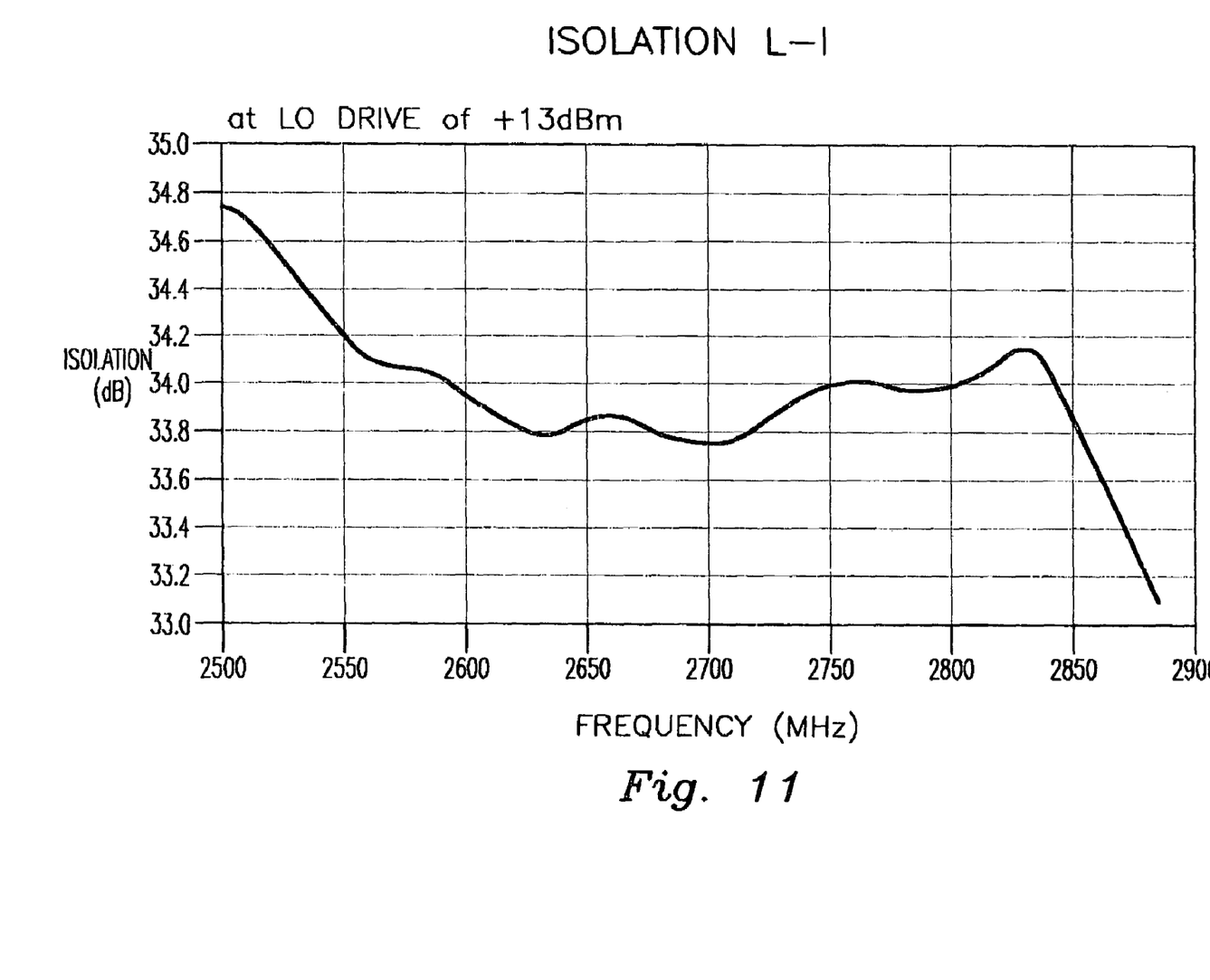
FIG. 11 is a graph of L-I isolation versus frequency.
Figure 12:
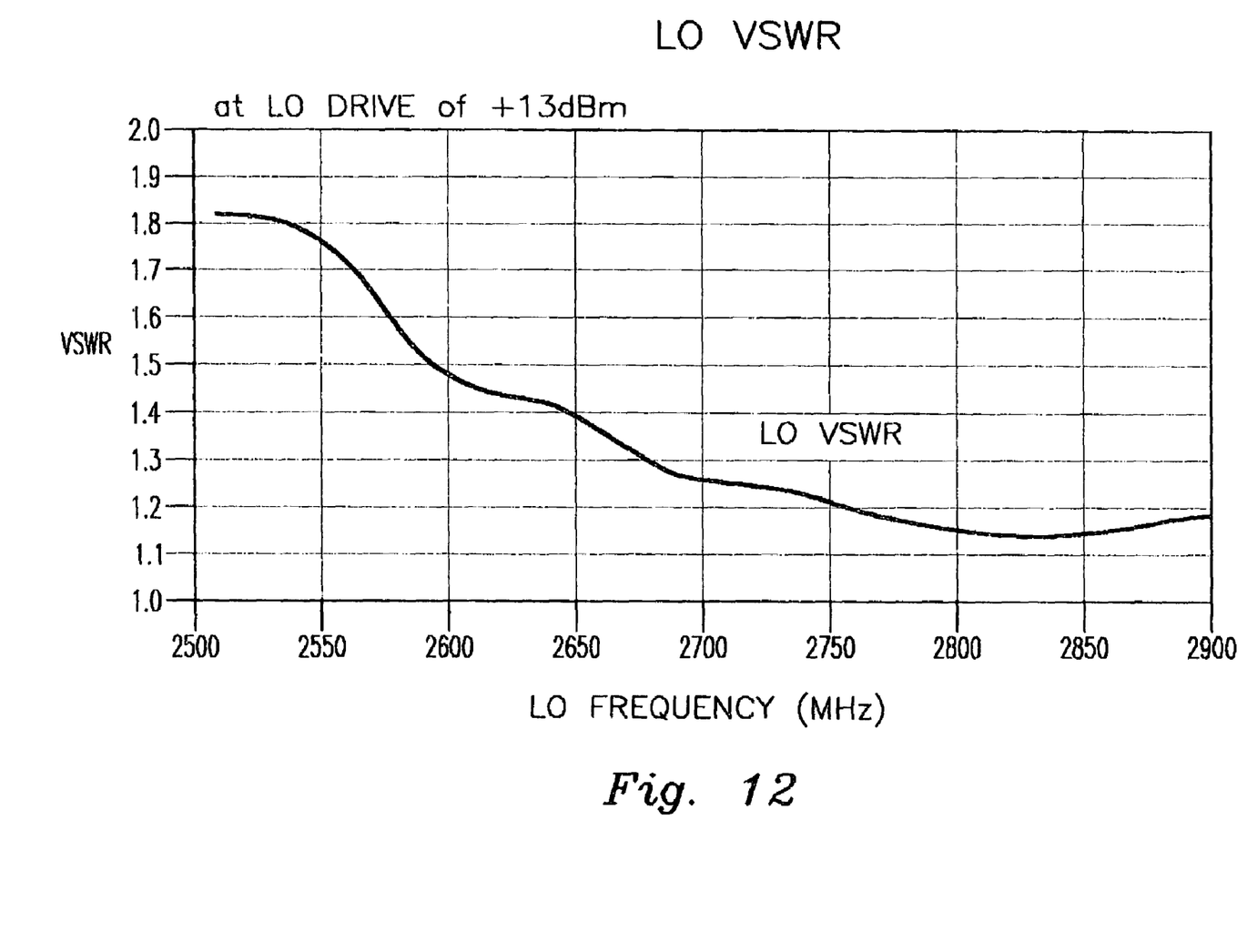
FIG. 12 is a graph of VSWR versus frequency at the LO port.
Figure 13:
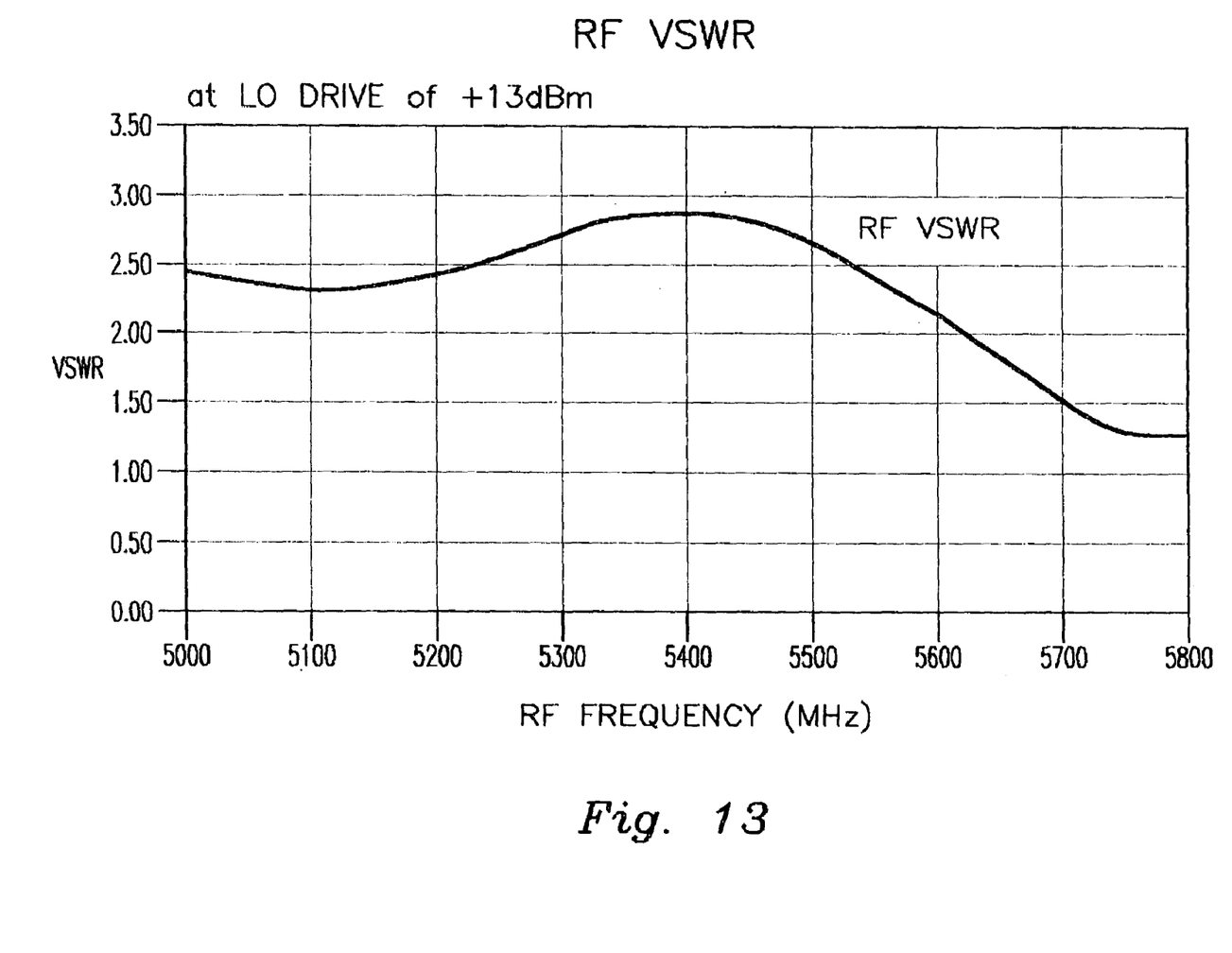
FIG. 13 is a graph of VSWR versus frequency at the RF port.
Figure 14:
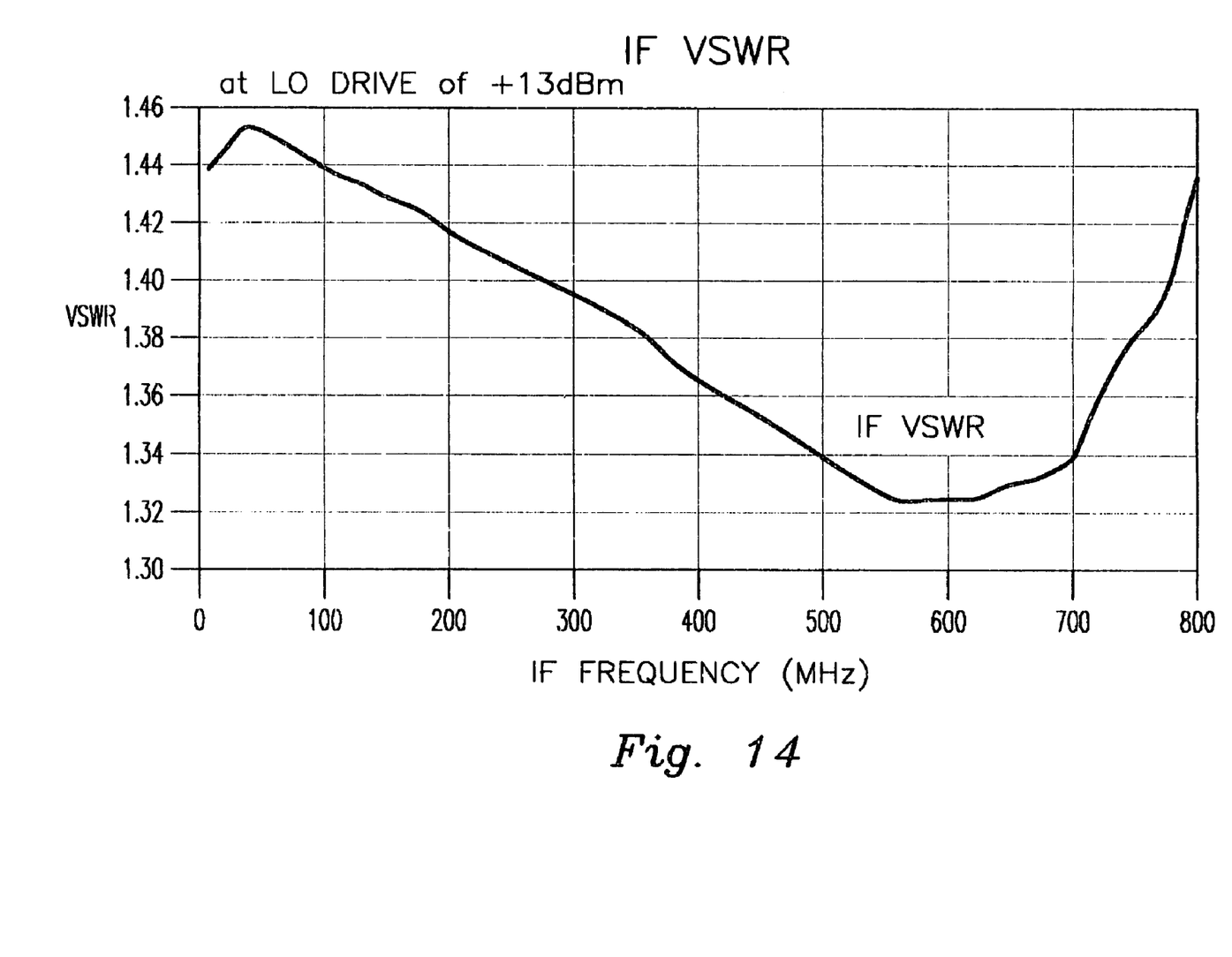
FIG. 14 is a graph of VSWR versus frequency at the IF port.

FIG. 7 shows a graph of conversion loss versus frequency for sub harmonic mixer 40. The conversion loss was 7.5 dB at an RF frequency of 5.6 GHz which is very good performance for such a small size mixer. FIG. 8 shows a graph of 2LO-RF isolation versus frequency. FIG. 9 shows a graph of 2LO-IF isolation versus frequency. FIG. 10 shows a graph of LO-RF isolation versus frequency. FIG. 11 shows a graph of LO-IF isolation versus frequency. FIG. 12 is a graph of VSWR versus frequency at the LO port. FIG. 13 is a graph of VSWR versus frequency at the RF port. FIG. 14 is a graph of VSWR versus frequency at the IF port.

The present invention has several advantages. Fabricating the mixer using an LTCC process results in a smaller package that has more uniform electrical characteristics. The use of the sub harmonic mixer with an LO signal frequency that is one half of the RF signal frequency provides for easier filtering of any parasitic signal component that may occur at the RF port and improved LO to RF isolation. The mixer of the present invention provides an improvement over previous mixers.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A mixer comprising:
   a) a first and second coupled line, the first coupled line connected to a local oscillator port for receiving a local oscillator signal;

b) a third and fourth coupled line, the third coupled line having one end connected to the first coupled line and the other end connected to ground;

c) a fifth and sixth coupled line, the sixth coupled line having one end connected to the second coupled line and the other end connected to ground;

d) a seventh inductor line having one end connected to ground and the other end connected to a first node, one end of the fourth and fifth coupled lines connected to the first node;

e) a first capacitor connected between the first node and ground;

f) four diodes connected together, the cathode of one diode connected to the anode of another diode;

g) the other end of the fourth and fifth coupled lines connected to the diodes;

h) an eighth inductor line having one end connected to the diodes and another end connected to an intermediate frequency port;

i) a second capacitor connected between the eighth line and a radio frequency port; and j) a third capacitor connected between the intermediate frequency port and ground.

2. The mixer according to claim 1, wherein the local oscillator signal frequency is approximately one half of a radio frequency signal frequency.

3. The mixer according to claim 1, wherein the coupled lines are located on layers of a low temperature co-fired ceramic substrate.

4. The mixer according to claim 3, wherein the first, fourth, fifth seventh and eighth lines are located on a first layer.

5. The mixer according to claim 3, wherein the second, third and sixth lines are located on a second layer.

6. The mixer according to claim 3, wherein the four diodes are located on a top layer.

7. A mixer for mixing an RF signal with a local oscillator signal to provide an intermediate frequency signal, comprising:

a low temperature co-fired ceramic substrate having a plurality of layers, the substrate including a top layer, a bottom layer and inner layers;

a first, fourth, fifth, seventh and eighth line located on a first inner layer;

a second, third and sixth line located on a second inner layer, the first and second inner layers located adjacent each other;

the first line connected to a local oscillator port for receiving the local oscillator signal;

the third line having one end connected to the first coupled line and the other end connected to ground;

the sixth line having one end connected to the second coupled line and the other end connected to ground;

the seventh line having one end connected to ground and the other end connected to a first node, one end of the fourth and fifth lines connected to the first node;

a first capacitor located on a third inner layer and connected between the first node and ground;

four diodes mounted on the top layer and connected together, the cathode of one diode connected to the anode of another diode;

the other end of the fourth and fifth lines connected to the diodes;

an eighth line having one end connected to the diodes and another end connected to an intermediate frequency port;

a second capacitor connected between the eight coupled line and a RF port, the RF port receiving the RF signal, the second capacitor located on the second inner layer;

a third capacitor connected between the intermediate frequency port and ground, the third capacitor located on the third inner layer; and a plurality of vias extending through the layers electrically connecting the lines, the capacitors, the diodes and the ports.

8. The mixer according to claim 7, wherein the first and second lines are electromagnetically coupled to each other.

9. The mixer according to claim 7, wherein the third and fourth lines are electromagnetically coupled to each other.

10. The mixer according to claim 7, wherein the fifth and sixth lines are electromagnetically coupled to each other.

11. The mixer according to claim 7, wherein the local oscillator signal frequency is approximately one half the RF signal frequency.

12. The mixer according to claim 7, wherein a ground plane is mounted on the bottom layer.

13. The mixer according to claim 7, wherein the four diodes are mounted in a semiconductor die.

14. A mixer comprising:

a local oscillator port for receiving a local oscillator signal;

a radio frequency port for receiving a radio frequency signal;

an intermediate frequency port for providing an intermediate frequency signal;

a first and second coupled line, the first coupled line connected to a local oscillator port, the first and second coupled lines having a dielectric layer therebetween;

a third and fourth coupled line, the third coupled line having one end connected to the first coupled line and the other end connected to ground, the third and fourth coupled lines having the dielectric layer therebetween;

a fifth and sixth coupled line, the sixth coupled line having one end connected to the second coupled line and the other end connected to ground, the fifth and sixth coupled lines having the dielectric layer therebetween;

a seventh inductor line having one end connected to ground and the other end connected to a first node, one end of the fourth and fifth coupled lines connected to the first node;

a first capacitor connected between the first node and ground;

four diodes connected together, the cathode of one diode connected to the anode of another diode, the other end of the fourth and fifth coupled lines connected to the diodes;

an eighth inductor line having one end connected to the diodes and another end connected to an intermediate frequency port;

a second capacitor connected between the eighth inductor line and the radio frequency port; and a third capacitor connected between the intermediate frequency port and ground.

15. The mixer according to claim 14 wherein the local oscillator signal frequency is approximately one half of the radio frequency signal frequency.

16. The mixer according to claim 14, wherein the dielectric layer is low temperature co-fired ceramic.

17. The mixer according to claim 14, further comprising:

a substrate having a first, second, third, fourth, fifth, sixth layer;

the first, fourth, fifth, seventh and eighth lines located on the second layer;
the second, third and sixth lines located on the third layer; and
the first and third capacitors located on the fifth layer.

18. The mixer according to claim 17, further comprising:
a plurality of terminals located on the sixth layer;
a plurality of bond pads located on the first layer.

19. The mixer according to claim 18, wherein the four diodes are mounted in a semiconductor die, the die mounted to the bond pads.

20. The mixer according to claim 17, wherein a plurality of vias extend through the substrate.

* * * * *